May 27, 1969 N. E. ANDERSSON 3,447,042

SEMI-CONDUCTOR DEVICE COMPRISING TWO PARALLEL-CONNECTED SEMI-CONDUCTOR SYSTEMS IN PRESSURE CONTACT

Filed May 31, 1966

INVENTOR.
NILS ERIC ANDERSSON
BY
Bailey, Stephens & Huettig
ATTORNEYS

United States Patent Office 3,447,042
Patented May 27, 1969

3,447,042

SEMI-CONDUCTOR DEVICE COMPRISING TWO PARALLEL-CONNECTED SEMI-CONDUCTOR SYSTEMS IN PRESSURE CONTACT

Nils Eric Andersson, Ludvika, Sweden, assignor to Allmänna Svenska Elektriska Aktiebolaget, Vasteras, Sweden, a corporation of Sweden Filed May 31, 1966, Ser. No. 554,176
Claims priority, application Sweden, May 28, 1965, 7,017/65
Int. Cl. H01l *3/00, 15/00*
U.S. Cl. 317—234 4 Claims

ABSTRACT OF THE DISCLOSURE

A semi-conductor system has a first and second semi-conductor rectifier, a first base member for the first semi-conductor rectifier and a second base member for the second semi-conductor rectifier, a counter-electrode and a compressing means pressing the first semi-conductor rectifier between the first base member and the counter electrode and the second semi-conductor rectifier between the second base member and the counter electrode, the base member being directly electrically connected to each other so that the semi-conductor rectifiers are electrically parallel-connected.

Figure 1:
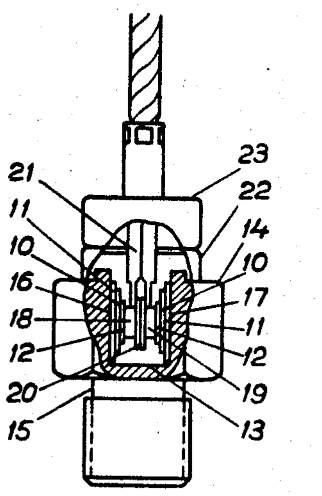

Semi-conductor systems for high currents usually comprise a semi-conductor system with a semi-conductor wafer of silicon or germanium which is provided on one side or both sides with support plates of a material with substantially the same coefficient of thermal expansion as the semi-conducting material, the support plates being fixed to the semi-conductor wafer for example by soldering. The support plates usually consist of molybdenum, tungsten, fernico or a similar iron-nickel-cobalt or iron-nickel alloy. The support plates are usually considerably thicker than the semi-conductor wafer. In known embodiments of such semi-conductor system having cooling on one side, the semi-conductor system is arranged at the one support plate on a base member of a material having good thermal conductivity, for example, copper, which is in contact with a cooling body, and at the other support plate in pressure contact with a counter-electrode, the pressure contact being effected with the help of a clamping device, whereby the semi-conductor system, the counter-electrode and the clamping device are arranged in a hermetically sealed casing which, besides the base member already mentioned, comprises a cover above the base member and joined to it. This cover consists of a metallic part situated nearest the base member and a second metallic part situated above the semi-conductor system and an intermediate part of electrically insulating material situated between the two metallic parts.

In semi-conductor systems with pressure contact between current terminal bodies and the support plates and where both said terminal bodies are used as cooling bodies or are connected to cooling bodies so that the semi-conductor rectifier is cooled from both sides it is known to enclose the semi-conductor rectifier with its semi-conductor wafer and support plate hermetically in a flat box to protect it against damaging influences of the surrounding atmosphere. The bottom and the lid of the box are arranged along and in contact with the outwardly facing surfaces of the semi-conductor rectifier. In these known devices, besides the bottom and the lid, the box comprises an intermediate piece in the form of a ring of insulating material arranged between the bottom and the lid.

To effect the pressure contact between the current terminal bodies and the semi-conductor rectifier, these bodies may be pressed against the semi-conductor rectifier by an outer clamping means which is mounted in the two bodies. It is then necessary either to make the clamping means of insulating material or to insulate the clamping means from one of the bodies by arranging a piece of insulating material where the clamping means touches this body.

In the above mentioned known semi-conductor systems which make use of pressure contacts instead of soldering there is the problem of effecting sufficiently stable bodies of insulating material which can take up the required pressure force, since the insulating materials used for this purpose must be able to withstand relatively great pressure or tensile stresses and simultaneously relatively high temperatures without being deformed. In certain cases, usually with one-sided cooling, they must also be able to be enclosed in the casing together with the semi-conductor rectifier. Ceramic or similar materials fulfill the requirements but it is usually necessary to take special precautions to ensure an even load and furthermore the dimensions must be increased for this reason only, which is a great disadvantage.

The disadvantages arising with earlier semi-conductor systems having pressure contacts are avoided according to the present invention which makes it possible to effect semi-conductor systems in which insulating materials are not subjected to any pressure or tensile stresses at all and which have a very compact construction.

The present invention thus relates to a semi-conductor system, for example a transistor, a thyristor or a crystal diode, in which a semi-conductor rectifier comprising a semi-conductor wafer is arranged on a base member and in pressure contact with a current terminal body. The invention is characterised in that the semi-conductor system comprises two electrically parallel-connected semi-conductor systems facing each other and each arranged on its own base member, between which semi-conductor systems is arranged a counter electrode, and that each semi-conductor rectifier is pressed between its base member and the counter electrode by a compressing means.

According to an advantageous embodiment of the invention the counter-electrode consists of parts arranged on both sides of a spring acting as compressing means which holds one of the semi-conductor systems pressed between its base member and one of the parts and the other semi-conductor rectifier pressed between its base member and another of the parts. In this case the semi-conducting may, for example, be arranged in a hollow in the head of a bolt intended to be mounted in a cooling body, the hollow suitably having two at least substantially parallel sides which serve as base members for the semi-conductor systems.

According to another advantageous embodiment of the invention the base members are arranged in heat-conducting contact with cooling bodies or arranged themselves to serve as cooling bodies, and the cooling bodies are arranged to keep each semi-conducting rectifier pressed between its base member and the counter-electrode with a compressing means arranged on the cooling bodies and pressing the cooling bodies against each other.

The semi-conductor rectifier may comprise a semi-conductor wafer of, for example, silicon or germanium which is provided on one or both sides with thin metal layers applied on the semi-conductor wafer, for example by deposition from vapour, cathode sputtering or by electrolytic deposition. The metal layers may be applied in connection with the doping of the semi-conductor wafer or in a separate process after the doping. As examples of metals in the layers may be mentioned gold, silver, copper, aluminium, nickel, lead and alloys containing one of the metals. The semi-conductor rectifier may also comprise support plates on one or both sides of the semi-conductor wafer, the support plate or plates being made of molybdenum, tungsten, fernico or some other material having approximately the same coefficient of thermal expansion as the semi-conductor wafer. Such support plates may be fixed to the semi-conductor wafer in a conventional manner. It is also possible to completely leave out the metal layers and support plates on the sides of the semi-conductor wafer. Then the semi-conductor rectifier is composed solely of the semi-conductor wafer. In the last mentioned case it is suitable to use semi-conductor wafers with highly doped surface layers.

The invention is particularly intended to be used in semi-conductor systems for high currents, such as for currents of 10 amps and above.

Figure 2:
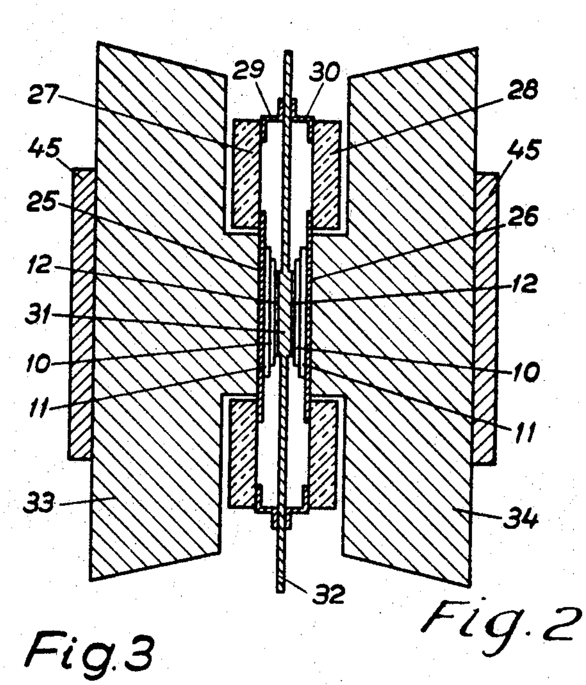
Figure 3:
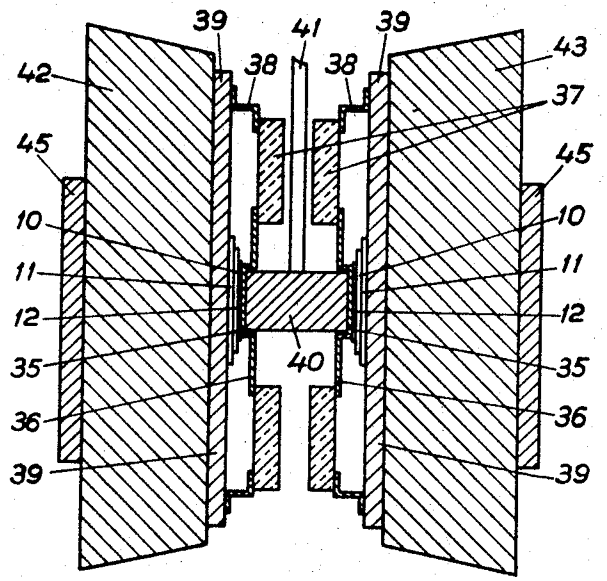

The invention will be explained in more detail by describing a number of embodiments with reference to the accompanying drawings in which FIGURE 1 is a section through a semi-conductor system according to the invention consisting of a crystal diode in which the counter-electrode consists of two parts which are pressed by a spring against the semi-conductor systems, FIGURES 2 and 3 show in section different embodiments of a crystal diode with two-sided cooling, in which the pressure is effected by a clamping means arranged on the cooling bodies and pressing these against each other so that the semi-conductor systems are subjected to pressure between the cooling bodies and the counter-electrode.

In the semi-conductor systems shown in FIGURES 1–3, a circular silicon wafer 10 of p-n-n$^+$ type is soldered on one side with an aluminium layer, not shown, to a support plate 11 of molybdenum or other material having approximately the same coefficient of thermal expansion as silicon and provided on the other side with an alloyed gold-antimony contact in the form of a layer 12. The semi-conductor rectifier consists of the elements 10, 11 and 12.

The semi-conductor rectifier is arranged in a hollow 13 in the head 14 of a copper bolt 15 which is intended to be mounted in a cooling means, not shown. The hollow 13 consists of a parallelepipedic groove with the two sides 16 and 17 parallel with the shaft of the bolt and acting as base members for the semi-conductor systems. The counter-electrode consists of two parts 18 and 19. These parts are pressed by a cup spring 20 against the two semi-conductor systems, which in turn are therefore pressed against the base members 16 and 17 so that each semi-conductor rectifier is arranged in pressure contact with both the counter-electrode and the base member. The parts of the counter-electrode are connected to the common connection conductor 21, so that the semi-conductor rectifiers are connected in parallel between the bolt and the conductor 21. The semi-conductor rectifier is hermetically sealed in a space which is limited by the hollow 13 and a cover comprising a metallic lower part 22 and an upper part 23 of insulating material, for example ceramic.

In the device according to FIGURE 2 the two semi-conductor systems are enclosed in a common box comprising two circular wafers 25 and 26, the two ceramic or porcelain rings 27 and 28 and the circular flanges 29 and 30. The parts 25, 26, 29 and 30 may consist of, for example, copper molybdenum, tungsten, iron-nickel alloy or iron-nickel-cobalt alloy and may be attached to the rings 27 and 28, for example by means of hard soldering with silver solder. The counter-electrode 31 is arranged between the semi-conductor systems and is provided with a connection conductor 32 which may be a circular or square wafer of copper which, for example, is soldered to the flanges 29 and 30. Outside the flat, circular wafers 25 and 26 the two cooling bodies 33 and 34 are arranged which also serve as base members for the semi-conductor systems. The cooling bodies, which may consist of, for example, copper, aluminium, silumin or some other metallic material having good thermal conductivity, may be formed and provided with a schematically shown clamping means 45 which, for example, may effect a compressing effect with bolts arranged outside the cooling bodies. The cooling bodies are pressed against each other by the clamping means so that the semi-conducting systems are pressed between the cooling bodies and the counter electrode 31. In this way each semi-conductor rectifier is arranged in pressure contact with both the counter-electrode and its base member.

In the arrangement according to FIGURE 3 each semi-conductor rectifier is enclosed in its own box. Each box comprises a central, circular part 36 provided with an indentation 35, a ceramic or porcelain ring 37, an outer circular flange 38 and a base 39 in the form of a circular plate. The parts 36 and 38 may be of the same material as mentioned above for the parts 25, 26, 29 and 30. The most suitable material for the base 39 is copper.

The counter-electrode 40 which is arranged between the semi-conductor systems at the indentations 35 is provided with the connection conductor 41. The cooling bodies 42 and 43 may consist of the same material as the cooling bodies 33 and 34. They may be shaped and provided with the same clamping means as shown in FIGURE 2. The cooling bodies are pressed against each other so that the semi-conductor systems are pressed between the cooling bodies and the counter-electrode 40. In this way each semi-conductor rectifier is arranged in pressure contact with both the counter-electrode and its base member.

The two semi-conductor wafers and their base members do not, as is the case in accordance with the figures, need to be arranged parallel to each other. One semi-conductor wafer and its base member may also be arranged at an acute angle to the other semi-conductor wafer and its base member, in which case it is necessary to apply pressure on the counter-electrode mainly against the point of the angle formed by the two semi-conductor wafers, to prevent the counter-electrode from slipping out along the surfaces of the semi-conductor systems which face the counter electrode.

If the semi-conductor system consists of a thyristor or a transistor, the necessary further electrical connections may be arranged to each semi-conductor rectifier, for example, by leading these connections through two holes in the insulator 23 according to FIGURE 1, through holes in the insulating rings 27 and 28 according to FIGURE 2 and through holes in each of the two insulating rings 37 according to FIG. 3.

I claim:

1. Semi-conductor rectifying system comprising one first and one second semi-conductor rectifier, each comprising a wafer of a semi-conducting material selected from the group consisting of silicon and germanium, one first base member for said first semi-conductor rectifier and one second base member for said second semi-conductor rectifier, a counter-electrode, and a compressing means, said compressing means pressing said first semi-conductor rectifier between said first base member and said counter-electrode and effecting a pressure contact between said first semi-conductor rectifier and said first base member and a pressure contact between said first semi-conductor rectifier and said counter-electrode and said compressing means pressing said second semi-conductor rectifier between said second base member and said counter-electrode and effecting a pressure contact between said second semi-conductor rectifier and said second base member and a pressure contact between said second semi-conductor rectifier and said counter-electrode, the base members being directly electrically connected to each other, so that the semi-conductor rectifiers are electrically parallel-connected.

2. Semi-conductor rectifying system as claimed in claim 1 in which said counter-electrode comprises at least one first and one second part and in which said compressing means comprises a spring arranged between said first part and said second part, said spring pressing said first semi-conductor rectifier between said first base member and said first part and said spring pressing said second semi-conductor rectifier between said second base member and said second part.

3. Semi-conductor rectifying system as claimed in claim 2 in which said first and said second semi-conductor rectifiers are arranged in a hollow in the head of a bolt, said hollow being provided with one first and one second wall, said first and said second wall being at least substantially parallel, said first wall constituting said first base member and said second wall constituting said second base member.

4. Semi-conductor device according to claim 1, in which said first base member is arranged in heat-conducting contact with a first cooling body and said second base member is arranged in heat-conducting contact with a second cooling body and said compressing means is arranged to press said first cooling body against said first base member and said second cooling body against said second base member.

References Cited

UNITED STATES PATENTS

| | | | |
|---|---|---|---|
| 1,905,525 | 4/1933 | Strobel | 317—234 |
| 2,665,399 | 1/1954 | Lingel | 317—234 |
| 2,780,758 | 2/1957 | Zetwo | 317—234 |
| 2,839,710 | 6/1958 | Doucot | 317—234 |
| 3,310,716 | 3/1967 | Emeis | 317—234 |
| 3,313,987 | 4/1967 | Boyer | 317—234 |
| 3,356,914 | 12/1967 | Whigham et al. | 317—234 |

FOREIGN PATENTS

| | | |
|---|---|---|
| 883,479 | 7/1953 | Germany. |

JOHN W. HUCKERT, *Primary Examiner.*

A. J. JAMES, *Assistant Examiner.*

U.S. Cl. X.R.

317—235